United States Patent [19]

Menachem

[11] 4,381,460
[45] Apr. 26, 1983

[54] BOOTSTRAP DRIVER CIRCUIT

[75] Inventor: Abraham Menachem, Herzlia, Israel

[73] Assignee: National Semiconductor Corporation, Santa Clara, Calif.

[21] Appl. No.: 153,485

[22] Filed: May 27, 1980

[51] Int. Cl.[3] .............. H03K 19/017; H03K 19/096; H03K 19/20; G11C 8/00

[52] U.S. Cl. .................. 307/449; 307/463; 307/482; 307/578; 365/104; 365/230

[58] Field of Search .............. 307/449–450, 307/453, 463, 468, 482, 270, 578, 583, 575; 365/94–95, 103–104, 230–231

[56] References Cited

U.S. PATENT DOCUMENTS

| | | | |
|---|---|---|---|
| 3,986,054 | 10/1976 | Hansen et al. | 365/104 X |
| 4,001,601 | 1/1977 | Schuster | 307/449 |
| 4,021,781 | 5/1977 | Caudel | 307/450 X |
| 4,051,388 | 9/1977 | Inukai | 307/449 X |
| 4,081,699 | 3/1978 | Hirt et al. | 307/449 X |
| 4,145,622 | 3/1979 | Hofmann et al. | 307/449 |
| 4,185,320 | 1/1980 | Takemae et al. | 307/463 |
| 4,311,930 | 1/1982 | Chan et al. | 307/575 |

OTHER PUBLICATIONS

Linton et al., "FET Decoder Circuit", *IBM Tech. Discl. Bull.*, vol. 12, No. 12, p. 2082, 5/70.
Radzik, "Multiple Image Read-Only Storage", *IBM Tech. Discl. Bull.*, vol. 14, No. 12, pp. 3737–3738, 5/72.
Kawagoe et al., "Minimum Size ROM Structure Compatible with Silicon Gate E/D MOSLSI", *IEEE-JSSC*, vol. SC-11, No. 3, pp. 360–364, 6/76.
Parikh, "High-Speed FET Decoder", *IBM Tech. Discl. Bull.*, vol. 18, No. 12, pp. 3955–3956, 5/76.

Primary Examiner—Larry N. Anagnos
Attorney, Agent, or Firm—Gail W. Woodward; Paul J. Winters; Neil B. Schulte

[57] ABSTRACT

A MOS two-phase boostrap driver circuit, having a bootstrap transistor with a gate selectively charged or discharged in response to the level of an input signal, provides for selectively charging the gate of the bootstrap transistor directly from a voltage supply.

5 Claims, 3 Drawing Figures

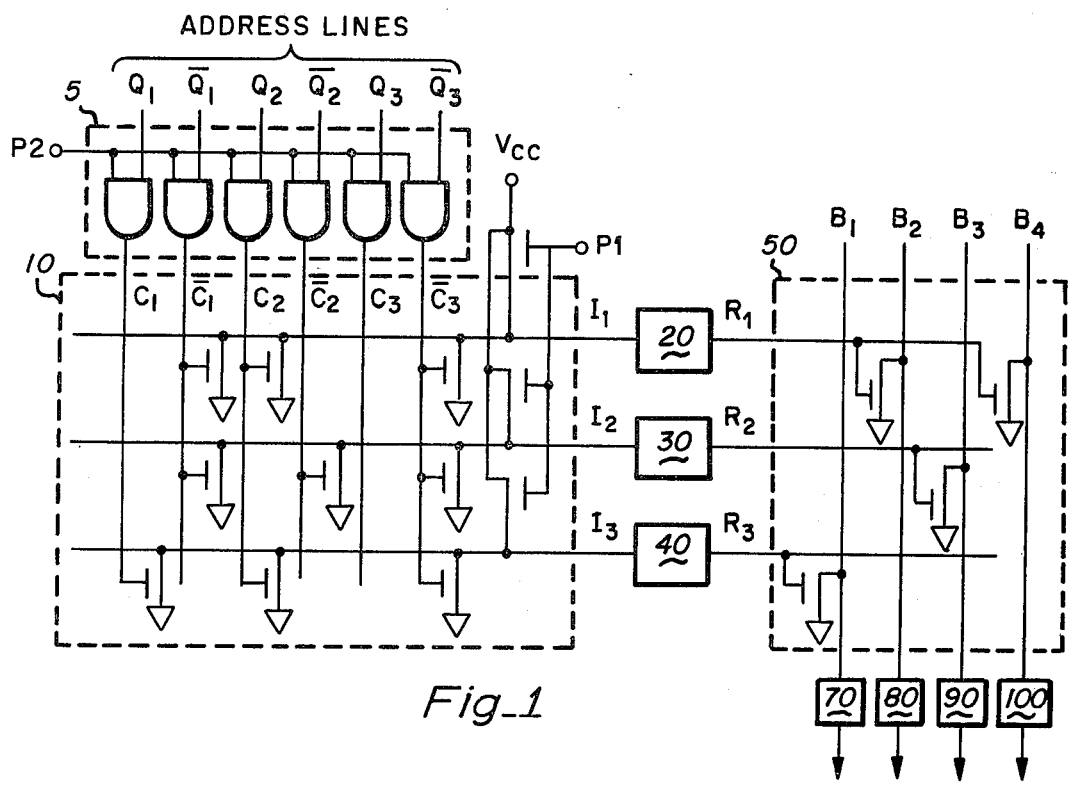
Fig_1
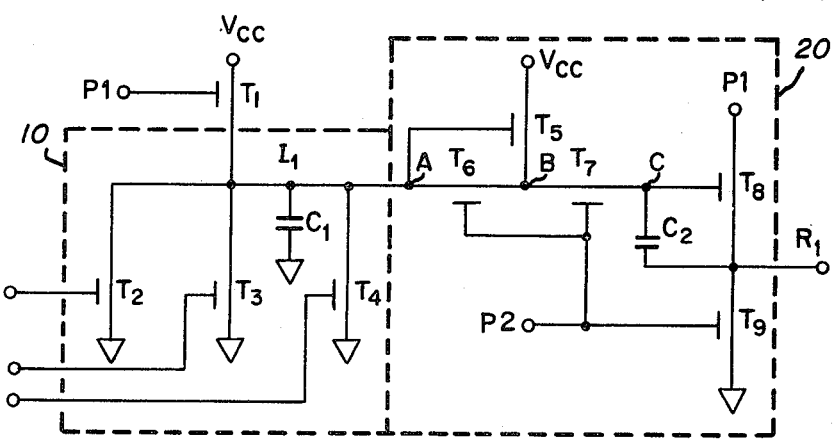
Fig_2
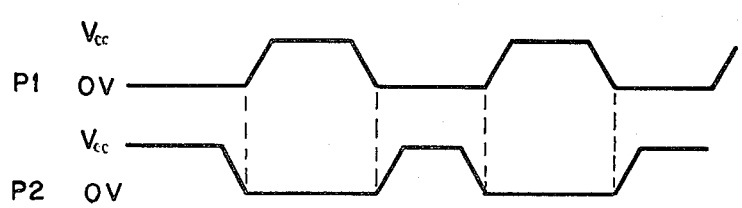
Fig_3

BOOTSTRAP DRIVER CIRCUIT

BACKGROUND OF THE INVENTION

Conventional two-phase bootstrap driver circuits, typically used to charge address lines of MOS read only memories (ROMs) have a bootstrap transistor, characterized by a capacitance between its gate and source, for selectively charging an address line of the ROM during an output phase in response to the application of an input signal to its gate during a prior input phase. The gate of the bootstrap transistor is isolated during the output phase so that the gate-source capacitance of the bootstrap transistor will cause the gate voltage to increase as the voltage of source, which is coupled to the address line, increases. Thus, the bootstrap transistor remains in its conductive mode and quickly charges the address line to the full supply voltage.

The input signals of conventional two-phase bootstrap driver circuits are provided by a capacitive output line of an address decoder. This output line is precharged during the output phase and selectively discharged during a subsequent input phase. The output line is coupled to the bootstrap transistor during the input phase for selectively charging or discharging its gate. However, since the output line of the address decoder and the gate of the bootstrap transistor are both characterized by capacitances, the charge on the output line is shared between the capacitances, reducing the voltage on the gate of the bootstrap transistor from the original voltage on the output line. Typically, the gate of the bootstrap transistor only achieves an amplitude of approximately 3 volts when a five volt supply is used. This low gate voltage results in a rate of charging of the address line that is slower than is desired.

SUMMARY OF THE INVENTION

In accordance with the preferred embodiment of the present invention, a two-phase bootstrap circuit having a bootstrap transistor with its gate isolated from an input signal and capacitively coupled to its source during a first phase provides for selectively coupling the gate of the bootstrap transistor to a voltage supply or ground during a second phase. A first transistor in the circuit has a gate coupled to receive the input signal and a drain coupled to the voltage supply. Second and third transistors have gates coupled to receive a clock signal during the second phase and are serially coupled between the gate and the source of the first transistor, and the source of the first transistor and the gate of the bootstrap transistor respectively. Thus, the gate of the bootstrap transistor is selectively charged from the voltage supply through the first and third transistors or discharged to a grounded input signal through the second and third transistors during the second phase in response to the amplitude of the input signal.

BRIEF DESCRIPTION OF THE DRAWINGS

FIG. 1 is a block diagram of a programmable logic array (PLA) having a word select circuit, an address decoder, three bootstrap drivers, a read only memory and four sense amplifiers.

FIG. 2 is a detailed schematic diagram of a bootstrap driver circuits of FIG. 1 in accordance with the preferred embodiment of the present invention.

FIG. 3 is an illustration of the clock waveforms used in the circuits of FIGS. 1 and 2.

DETAILED DESCRIPTION OF THE PREFERRED EMBODIMENT

Referring to FIG. 1, address lines Q1, Q2 and Q3 and their complement lines $\overline{Q1}$, $\overline{Q2}$ and $\overline{Q3}$, receive signals representative of the addresses of data words stored in a programmable logic array (PLA) circuit. Word select circuit 5 is coupled to receive the signals on the address lines and is further coupled to receive clock signal P2. The signals on the address lines are logically "ANDED" with clock signal P2 to produce output signals on the column lines of word select circuit 5 during the second phase of the clock (P2 being in its high voltage state). These column lines are coupled to the column lines C1, $\overline{C1}$, C2, $\overline{C2}$, C3 and $\overline{C3}$ of an address decoder 10. Address decoder 10 is constructed so that one of its output lines I1, I2 or I3 will become active in response to signals representative of the address of a stored data word being applied to the address lines. For instance, if the logical input on the address lines is a 101, (Q1=1, Q2=0, Q3=1) during phase two, address decoder 10 will produce a high voltage signal on output line I1 and low voltage signals on the other output lines. Voltage signals will result from array transistors discharging the output lines I2 and I3 to ground. Address decoder 10 is also coupled to the voltage supply Vcc which is coupled to precharge the output lines I1, I2, and I3 during the first phase (when clock signal P1 is in its high voltage state). Further, the output lines can be selectively discharged to ground by the array transistors of address decoder 10 during phase two in response to signals on the column lines. Thus, the output lines, which are characterized by a capacitance, will either maintain the precharge, or be selectively discharged to provide a signal on one of the output lines during the second phase.

The output lines of address decoder 10 are coupled to bootstrap driver circuits. Specifically, output lines I1, I2 and I3 are coupled to bootstrap driver circuits 20, 30, and 40, respectively. The bootstrap driver circuits sense the voltages on output lines I1, I2 and I3 and charge address lines R1, R2 and R3 of read only memory 50 in response. Each address line corresponds to an address of a data word stored in read only memory 50.

In operation, bootstrap driver 20 produces a signal on address line R1 in response to an input signal on line I1. Read only memory 50 produces signals on bit lines B1, B2, B3 and B4 representative of the logical bits in the selected data word associated with address line R1. These data bits are sensed by sense amplifiers 70, 80, 90 and 100 and subsequently used in associated circuitry such as a microprocessor.

Bootstrap driver circuit 20 is shown in detail in the schematic diagram, FIG. 2. Further, some of the circuitry associated with the address decoder 10 is also illustrated. Voltage supply Vcc is coupled to the drain of transistor T1 which has a source coupled to output line I1. The gate of transistor T1 is coupled to the clock signal P1 so that the output line I1 is precharged to a voltage equal to Vcc minus Vth during the first phase. That is, since the clock signal P1 has a maximum voltage of Vcc, the output line I1 is charged to a voltage equal to the signal applied to the gate of transistor T1 less the threshold voltage of transistor T1. The charging of output line I1 is modeled by the capacitance C1 associated with line I1. This capacitance is not a discrete element in the preferred embodiment of the invention, but is a parasitic capacitance associated with the output line itself.

Column lines $\overline{C1}$, C2 and $\overline{C3}$ of address decoder 10 are coupled to the gates of array transistors T2, T3 and T4. These column lines are active only during the second phase, and act to discharge the output line I1 to ground through the array transistors in response to a signal appearing on any one of the column lines coupled to output line I1. Thus, in operation the address decoder 10 operates as a NOR gate, and output line will be discharged to ground in response to any address except 101.

Output line I1 is also coupled to node A of bootstrap driver circuit 20. Node A is coupled to the gate of transistor T5 which selectively couples the voltage supply Vcc to node B in response to the application of a signal to node A. Transistors T6 and T7 selectively couple or isolate nodes A and B and nodes B and C respectively in response to clock signal P2. Node C is coupled to the gate of bootstrap transistor T8 which is characterized by capacitance between its gate and its source. This capacitance may be a discrete element, however, in the preferred embodiment of the present invention it has been implemented by taking advantage of the Miller capacitance associated with transistor T8. Bootstrap transistor T8 selectively couples clock signal P1 to the address line R1 in response to the application of a signal to its gate. Finally, transistor T9 is coupled to discharge address line R1 during phase 2.

In the preferred embodiment of the present invention, transistors T1, T5, T7 and T8 have been designed as soft enhancement, XMOS transistors. These transistors are characterized by a relatively low threshold voltage (Vth) of 0.04 volt. The threshold voltages of the other transistors illustrated in FIG. 2 is typically 1.2 volts. The relative differences in the threshold voltage of the transistors is advantageous to the operation of the circuit as described below.

In operation, the circuitry of FIG. 2 operates as follows. During phase one, output line I1 and node A are charged to a voltage of approximately Vcc minus 0.4 volts. Vcc has a preferred value of approximately 5 volts, thus node A is charged to a voltage of approximately 4.6 volts. The voltage on the gate of transistor T5 turns transistor T5 on, which charges node B to a voltage of approximately 4.2 volts. That is, node B is charged to a voltage equal to the voltage on the gate of transistor T5 less the threshold voltage of transistor T5.

During phase two, the bootstrap circuit 20 operates in two different modes depending upon whether node A is left precharged or is discharged by one of the array transistors T2, T3 or T4. In the first mode, assuming node A is left at 4.6 volts during phase two, transistor T7 is on (in its conductive state) and will conduct charge to node C. Transistors T5 and T6 will conduct charge from node A and voltage supply Vcc to nodes B and C. The voltage at node A will discharge slightly, to approximately 4.3 volts, during the time required to change node B to a voltage of 3.8 volts. Transistor T6 then turns off, since the voltage difference between its gate and node B is less than its threshold voltage. Transistor T5 continues to charge nodes B and C until they reach a voltage of approximately 3.9 volts.

In the second mode, wherein node A is discharged to ground during the second phase by one of the address decoder transistors T2, T3 or T4, transistors T6 and T7 are both on during the second phase. Transistor T5 is off, and node C will discharge to the ground voltage.

In either mode, transistor T9 is on during phase two and will discharge address line R1 to ground.

During the sequent phase one, address line R1 will be selectively charged to Vcc through T8 or left discharged in response to a high or a low voltage on node C.

FIG. 3 is an illustration of the waveforms of the clock signals used in the circuitry of FIGS. 1 and 2. The explanation of the operation of the circuits has assumed that the clock signals P1 and P2 have low voltage levels equal to the ground voltage and high voltage levels equal to the voltage supply Vcc and that the clock signals P1 and P2 do not have high voltages occurring at the same times. Rather, the high voltage levels of the clock signals P1 and P2 occur at alternating times as illustrated.

I claim:

1. A two-phase field effect transistor circuit for selectively providing an output signal on an output line in response to an input signal comprising:
   means for providing a reference voltage;
   means for providing a supply voltage;
   means for providing alternating first and second clock signals;
   a first transistor having a gate coupled to receive the input signal, a first terminal coupled to receive the supply voltage and a second terminal;
   a second transistor having a gate coupled to receive the second clock signal, a first terminal coupled to the gate of the first transistor, and a second terminal coupled to the second terminal of the first transistor;
   a third transistor having a gate coupled to receive the second clock signal, a first terminal coupled to the second terminal of the first transistor, and a second terminal;
   a fourth transistor having a gate coupled to receive the second clock signal, a first terminal coupled to the output line, and a second terminal coupled to receive the reference voltage;
   a fifth transistor having a gate coupled to the second terminal of the third transistor, a first terminal coupled to the output line and a second terminal coupled to receive the first clock signal; and
   means for providing a capacitance between the gate of the fifth transistor and the output line.

2. A two-phase circuit for selectively providing an output signal as in claim 1 further comprising:
   capacitive means coupled to the gate of the first transistor for capacitively storing signals applied thereto:
   a sixth transistor having a gate coupled to receive the first clock signal, a first terminal coupled to receive the supply voltage, and a second terminal coupled to the capacitive means; and
   a seventh transistor having a gate coupled to receive a control signal, a first terminal coupled to the capacitive means, and a second terminal coupled to receive the reference voltage.

3. A MOS integrated memory circuit for providing data signals representative of a data word selected in response to an address signal comprising a plurality of two-phase circuits as in claim 1 and further comprising an address decoder coupled to the two-phase circuits for providing an input signal to one of the two-phase circuits selected in response to the value of the address signal; and memory means for providing data signals representative of a data word selected in response to an output signal from the selected two-phase circuit.

4. A two-phase circuit as in claims 1 or 2 wherein the threshold voltages of the transistors, the amplitude of the supply voltage and the high voltage level of the second clock signal are such that the second transistor is in a nonconductive state in response to the second clock signal when the first and second terminals of the second transistor are at voltage levels substantially equal to the supply voltage and in a conductive state in response to the second clock signal when the first or second terminal of the second transistor is at a voltage level substantially equal to the reference voltage.

5. A two-phase circuit as in claim 2 integrated on a single chip wherein the first, third and sixth transistors have a voltage threshold which is less than the voltage threshold of the second transistor.

* * * * *